United States Patent
Girt et al.

(10) Patent No.: US 8,158,537 B2
(45) Date of Patent: Apr. 17, 2012

(54) CHALCOGENIDE ABSORBER LAYERS FOR PHOTOVOLTAIC APPLICATIONS AND METHODS OF MANUFACTURING THE SAME

(75) Inventors: Erol Girt, Burnaby (CA); Mariana Munteanu, Santa Clara, CA (US)

(73) Assignee: AQT Solar, Inc., Sunnyvale, CA (US)

( * ) Notice: Subject to any disclaimer, the term of this patent is extended or adjusted under 35 U.S.C. 154(b) by 0 days.

(21) Appl. No.: 12/953,867

(22) Filed: Nov. 24, 2010

(65) Prior Publication Data

US 2011/0124150 A1     May 26, 2011

Related U.S. Application Data

(60) Provisional application No. 61/263,899, filed on Nov. 24, 2009.

(51) Int. Cl.
*H01L 31/0272*     (2006.01)

(52) U.S. Cl. .................... 438/797; 257/E31.01

(58) Field of Classification Search ............. 257/E31.01; 427/76; 438/95, 797
See application file for complete search history.

(56) References Cited

U.S. PATENT DOCUMENTS

| | | | |
|---|---|---|---|
| 2007/0243657 A1* | 10/2007 | Basol et al. | 438/95 |
| 2008/0169025 A1* | 7/2008 | Basol et al. | 136/262 |
| 2009/0130796 A1* | 5/2009 | Taunier et al. | 438/94 |

* cited by examiner

*Primary Examiner* — William D Coleman
*Assistant Examiner* — Daniel Shook
(74) *Attorney, Agent, or Firm* — Baker Botts L.L.P.

(57) ABSTRACT

In one example embodiment, a method includes depositing one or more thin-film layers onto a substrate. More particularly, at least one of the thin-film layers comprises at least one electropositive material and at least one of the thin-film layers comprises at least one chalcogen material suitable for forming a chalcogenide material with the electropositive material. The method further includes annealing the one or more deposited thin-film layers at an average heating rate of or exceeding 1 degree Celsius per second. The method may also include cooling the annealed one or more thin-film layers at an average cooling rate of or exceeding 0.1 degrees Celsius per second.

38 Claims, 5 Drawing Sheets

CHALCOGENIDE ABSORBER LAYERS FOR PHOTOVOLTAIC APPLICATIONS AND METHODS OF MANUFACTURING THE SAME

CROSS-REFERENCE TO RELATED APPLICATIONS

The present application claims priority to U.S. Provisional Patent Application Ser. No. 61/263,899 filed Nov. 24, 2009, which is incorporated by reference herein for all purposes.

TECHNICAL FIELD

The present disclosure generally relates to the manufacturing of photovoltaic devices, and more particularly, to the use of annealing in forming chalcogenide absorbers for such devices.

BACKGROUND

Semiconducting chalcogenide films are typically used as absorber layers in photovoltaic devices, such as solar cells. A chalcogenide is a chemical compound consisting of at least one chalcogen ion (group 16 (VI) elements in the periodic table, e.g., sulfur (S), selenium (Se), and tellurium (Te)) and at least one more electropositive element. As those of skill in the art will appreciate, references to chalcogenides are generally made in reference to sulfides, selenides, and tellurides only. Thin film based solar cell devices may utilize these chalcogenide semiconductor materials as the absorber layer(s) as is or, alternately, in the form of an alloy with other elements or even compounds like oxides, nitrides and carbides, among others. chalcogenide (both single and mixed) semiconductors have optical band gaps well within the terrestrial solar spectrum, and hence, can be used as photon absorbers in thin film based solar cells to generate electron hole pairs and convert light energy to usable electrical energy.

Physical vapor deposition (PVD) based processes, and particularly sputter based deposition processes, have conventionally been utilized for high volume manufacturing of such thin film layers with high throughput and yield. These thin film layers can be deposited by the sputtering (in the form of reactive/non-reactive or co-sputtering) of high purity sputter targets.

DESCRIPTION OF EXAMPLE EMBODIMENTS

Particular embodiments of the present disclosure relate to the use of annealing in forming chalcogenide absorbers for photovoltaic devices.

Copper indium gallium diselenide (e.g., $Cu(In_{1-x}Ga_x)Se_2$, where x is less than or equal to approximately 0.7), copper indium gallium selenide sulfide (e.g., $Cu(In_{1-x}Ga_x)(Se_{1-y}S_y)_2$, where x is less than or equal to approximately 0.7 and y is less than or equal to approximately 0.99), and copper indium gallium disulfide (e.g., $Cu(In_{1-x}Ga_x)S_2$, where x is less than or equal to approximately 0.7), each of which is commonly referred to as a "CIGS" material, have been successfully used in the fabrication of thin film absorbers in photovoltaic cells largely due to their relatively large absorption coefficients. In fact, photovoltaic cells having photovoltaic efficiencies greater or equal than approximately 20% have been manufactured using copper indium gallium diselenide absorber layers. Efforts to minimize the defect density in the absorber layer(s) (hereinafter referred to as "absorber layer" or "absorber") have enabled the manufacture of high quality CIGS thin film photovoltaic cells. By way of example, reducing the defect density in the absorber layer may be achieved by heating the CIGS material close to its melting temperature, which facilitates grain growth and defect removal in the absorber layer. However, unfortunately, the melting temperature of CIGS materials is relatively large (e.g., close to 1000 degrees Celsius) and, thus, this approach is generally not economical from a fabrication stand point. Furthermore, in order to use glass substrates the fabrication process can generally not significantly exceed process temperatures of approximately 500 degrees Celsius.

Figure 1:
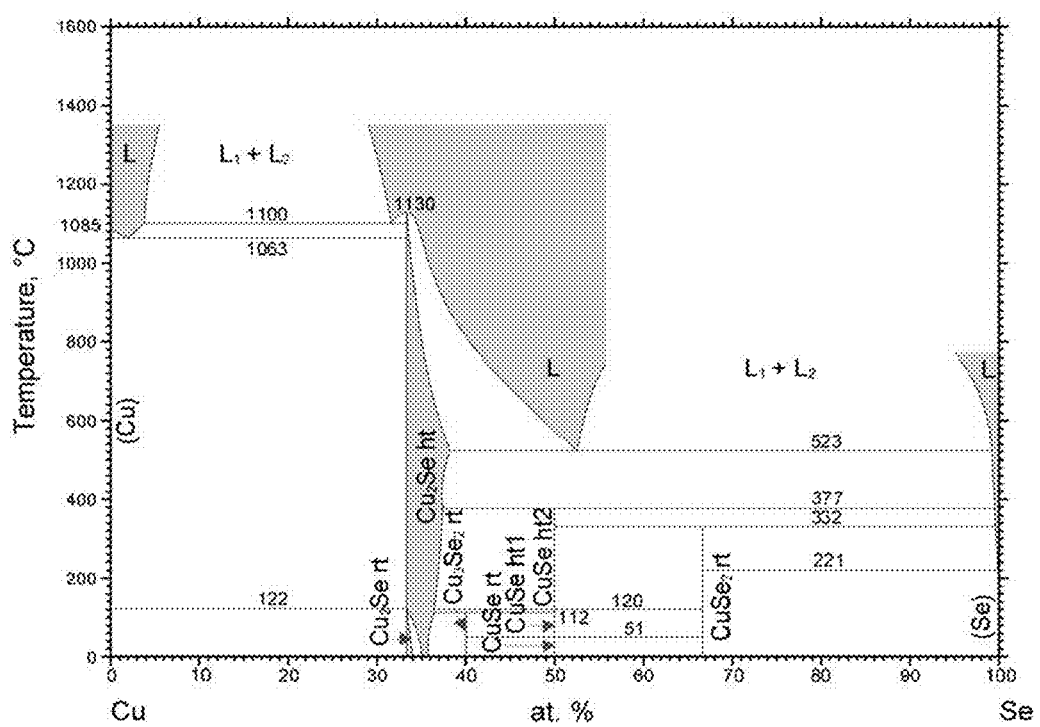
FIG. 1 shows an equilibrium Cu—Se phase diagram.
Figure 2:
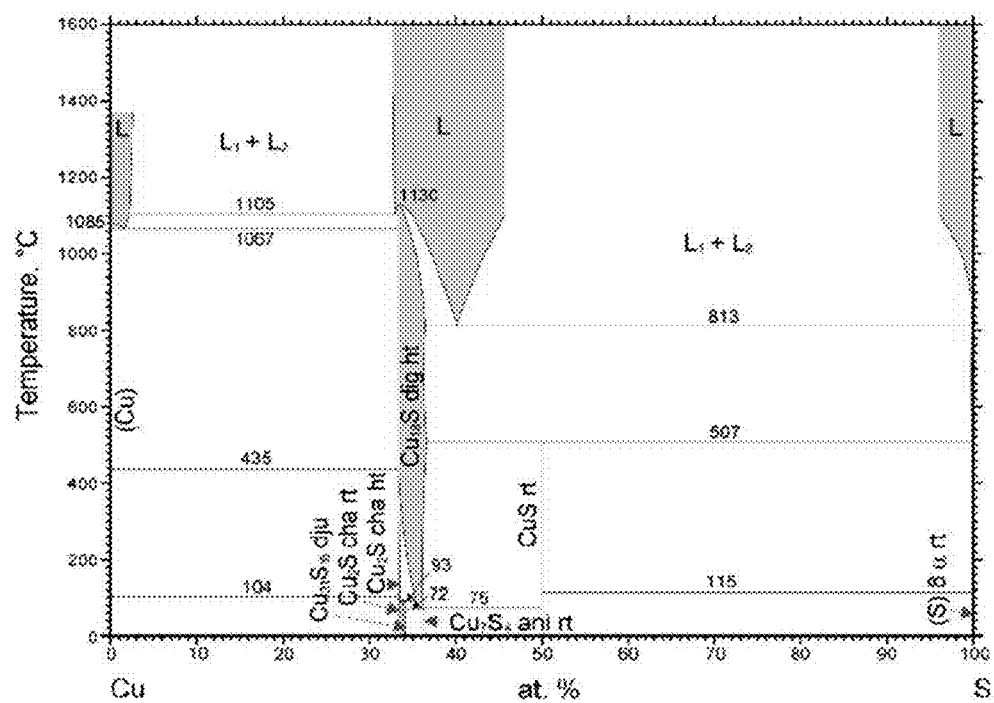
FIG. 2 shows an equilibrium Cu—S phase diagram.

It has been determined that, in order to manufacture photovoltaic cells having efficiencies at or exceeding 12%, Se and/or S have to be present in the CIGS absorber. Unfortunately, controlling Se and S compositions in CIGS materials has conventionally not been easy to achieve. Se and S have low vapor pressures and, thus, can escape from Cu and In layers during annealing or deposition at high process temperatures. In CuSe and CuS layers, this generally results in an increase in the Cu/Se or Cu/S ratios, respectively, as well as an increase in the melting point of these layers. By way of example, as shown in the equilibrium Cu—Se phase diagram of FIG. 1, the $Cu_2Se$ material has a melting point over twice that of $Cu_{1-x}Se_x$ (where x is greater than or equal to approximately 0.53). Similarly, as shown in the equilibrium Cu—S phase diagram of FIG. 2, the $Cu_{1.8}S$ material also has a much higher melting temperature than $Cu_{1-x}S_x$ (where x is greater than or equal to approximately 0.5). Loss of Se and S in CIGS layers can result in the presence of Se and S vacancies in the resultant absorber layers than can diminish the electrical performance of these CIGS absorbers. Additionally, the loss of Se and S can induce the formation of phases with different stoichiometry than that of copper indium gallium diselenide and copper indium gallium disulfide. These induced phases often have detrimental effects on the electrical performance of CIGS absorber layers.

One method of controlling Se or S compositions is to sputter or anneal Cu and In layers in the presence of $H_2S$ and/or $H_2Se$. Both $H_2S$ and $H_2Se$ are toxic and flammable, and thus, must be handled with care. However, such a method does allow for precise dosing and very tight control of the chalcogenide constituent. Another method involves sputtering or annealing Cu and In layers in an atmosphere of Se or S vapors. However, thermal evaporation of Se and S is conventionally not easy to control in high throughput fabrication processes. The sulfurization/selenization occurs in an environment of excess chalcogenide and cannot be precisely dosed or controlled. Furthermore, to minimize Se or S loss, the Cu and In layers can be rapidly annealed. By way of example, in a rapid annealing process, the temperature of the substrate upon which the photovoltaic cells are deposited/grown may be increased a few degrees Celsius per second (or faster) to minimize Se or S evaporation.

In particular embodiments, a CIGS absorber layer is formed by annealing Cu and/or In containing thin films. In some embodiments, the annealing includes pulsed or flash annealing. By way of example, the annealing process of particular embodiments is performed on one of the four example multilayer structures described below.

The first example multilayer structure comprises [Cu/In$_{1-x}$Ga$_x$]$_N$/Se$_{1-y-z}$S$_y$Te$_z$ (where, in particular embodiments, $x \leq 0.7$, $0 \leq y \leq 1$, $0 \leq z \leq 1$, $N \leq 100$) multilayers. In particular embodiments, the thickness of each layer in the multilayer structure may range from 0 to 4 µm while the total thickness of the N layer structure is less than approximately 8 µm. By way of example, the following layer structures may be used for the subsequent annealing process of particular embodiments:

a) [Cu (0.15-0.5 µm thickness)/In$_{1-x}$Ga$_x$ (0.3-1.1 µm thickness)]$_N$/Se$_{1-y}$S$_y$(0.6-4.0 µm thickness), b) Cu (0.15-0.5 µm thickness)/In$_{1-x}$Ga$_x$ (0.3-1.1 µm thickness)/Se$_{1-y-z}$S$_y$Te$_z$ (0.6-4.0 µm thickness), c) [In$_{1-x}$Ga$_x$ (0.3-1.1 µm thickness)/Cu (0.15-0.5 µm thickness)]$_N$/Se$_{1-y}$S$_y$(0.6-4.0 µm thickness), d) In$_{1-x}$Ga$_x$ (0.3-1.1 µm thickness)/Cu (0.15-0.5 µm thickness)/Se$_{1-y-z}$S$_y$Te$_z$ (0.6-4.0 µm thickness), e) In$_{1-x}$Ga$_x$ (0.15-0.55 µm thickness)/Cu (0.08-0.25 µm thickness)/In$_{1-x}$Ga$_x$ (0.15-0.55 µm thickness)/Cu (0.08-0.25 µm thickness)/Se$_{1-y-z}$S$_y$Te$_z$ (0.6-4 µm thickness), f) In$_{1-x}$Ga$_x$ (0.25-1.0 µm thickness)/Cu (0.15-0.5 µm thickness)/In$_{1-x}$Ga$_x$ (0.03-0.11 µm thickness)/Se$_{1-y-z}$S$_y$Te$_z$ (0.6-4 µm thickness), g) In$_{1-x}$Ga$_x$ (0.25-1.0 µm thickness, Ga concentration $0.2 \leq x \leq 0.5$)/Cu (0.15-0.5 µm thickness)/In$_{1-x}$Ga$_x$ (0.03-0.11 µm thickness, Ga concentration $0.1 \leq x \leq 0.3$)/Se$_{1-y-z}$S$_y$Te$_z$ (0.6-4 µm thickness).

The second example multilayer structure comprises [(In$_{1-x}$Ga$_x$)$_{1-\alpha}$(Se$_{1-y-z}$S$_y$Te$_z$)$_\alpha$/Cu$_{1-\beta}$(Se$_{1-y-z}$S$_y$Te$_z$)$_\beta$]$_N$ (where, in particular embodiments, $x \leq 0.7$, $\alpha \leq 0.8$, $\beta \leq 0.8$, $0 \leq y \leq 1$, $0 \leq z \leq 1$, $N \leq 100$) multilayers. In particular embodiments, the thickness of each layer in the multilayer structure may range from 0 to 6 µm while the total thickness of the N layer structure is less than approximately 8 µm. By way of example, following layer structures may be used for the subsequent annealing process of particular embodiments:

a) [(In$_{1-x}$Ga$_x$)$_{1-\alpha}$(Se$_{1-y}$S$_y$)$_\alpha$ (0.5-2.5 µm thickness)/Cu$_{1-\beta}$(Se$_{1-y}$S$_y$)$_\beta$ (0.3-2 µm thickness)]$_N$, b) (In$_{1-x}$Ga$_x$)$_{1-\alpha}$(Se$_{1-y-z}$S$_y$Te$_z$)$_\alpha$ (0.5-2.5 µm thickness)/Cu$_{1-\beta}$(Se$_{1-y-z}$S$_y$Te$_z$)$_\beta$ (0.3-2 µm thickness), c) (In$_{1-x}$Ga$_x$)$_{1-\alpha}$(Se$_{1-y-z}$S$_y$Te$_z$)$_\alpha$ (0.45-2.25 µm thickness)/Cu$_{1-\beta}$(Se$_{1-y-z}$S$_y$Te$_z$)$_\beta$ (0.3-2 µm thickness)/(In$_{1-x}$Ga$_x$)$_{1-\alpha}$(Se$_{1-y-z}$S$_y$Te$_z$)$_\alpha$ (0.05-0.25 µm thickness), d) (In$_{1-x}$Ga$_x$)$_{1-\alpha}$(Se$_{1-y-z}$S$_y$Te$_z$)$_\alpha$ (0.45-2.25 µm thickness, Ga concentration $0.2 \leq x \leq 0.5$)/Cu$_{1-\beta}$(Se$_{1-y-z}$S$_y$Te$_z$)$_\beta$ (0.3-2 µm thickness)/(In$_{1-x}$Ga$_x$)$_{1-\alpha}$(Se$_{1-y-z}$S$_y$Te$_z$)$_\alpha$ (0.05-0.25 µm thickness, Ga concentration $0.1 \leq x \leq 0.3$), e) [(In$_{1-x}$Ga$_x$)$_{1-\alpha}$(Se$_{1-y}$S$_y$)$_\alpha$ (0.45-2.25 µm thickness, Ga concentration $0.2 \leq x \leq 0.5$)/Cu$_{1-\beta}$(Se$_{1-y}$S$_y$)$_\beta$ (0.3-2 µm thickness)/(In$_{1-x}$Ga$_x$)$_{1-\alpha}$(Se$_{1-y}$S$_y$)$_\alpha$ (0.05-0.25 µm thickness, Ga concentration $0.1 \leq x \leq 0.3$)]$_N$.

The third example multilayer structure comprises Cu$_\alpha$(In$_{1-x}$Ga$_x$)$_\beta$(Se$_{1-y-z}$S$_y$Te$_z$)$_{1-\alpha-\beta}$, (where, in particular embodiments, $0.1 \leq \alpha \leq 0.4$, $0.1 \leq \beta \leq 0.4$, $\alpha+\beta \leq 0.7$, $x \leq 0.7$, $x \leq 0.7$, $0 \leq y \leq 1$, $0 \leq z \leq 1$) layer (for $0.5 < \alpha+\beta \leq 0.7$ the layer is annealed in the presence of H$_2$S and/or H$_2$Se). In particular embodiments, the thickness of the layer can range from 0.8 to 8 µm. By way of example, following layer structures may be used for the subsequent annealing process of particular embodiments:

a) Cu$_\alpha$(In$_{1-x}$Ga$_x$)$_\beta$(Se$_{1-y}$S$_y$)$_{1-\alpha-\beta}$ ($0.18 \leq \alpha \leq 0.25$, $0.24 \leq \beta \leq 0.28$, $\alpha+\beta \leq 0.5$, $x \leq 0.7$, $0 \leq y \leq 1$), b) Cu$_\alpha$(In$_{1-x}$Ga$_x$)$_\beta$(Se$_{1-y-z}$S$_y$Te$_z$)$_{1-\alpha-\beta}$ ($0.18 \leq \alpha \leq 0.25$, $0.2 \leq \beta \leq 0.28$, $\alpha+\beta \leq 0.5$, $x \leq 0.7$, $0 \leq y \leq 1$, $z \leq 0.1$), c) Cu$_\alpha$(In$_{1-x}$Ga$_x$)$_\beta$(Se$_{1-y-z}$S$_y$Te$_z$)$_{1-\alpha-\beta}$ ($0.22 \leq \alpha \leq 0.3$, $0.17 \leq \beta \leq 0.25$, $\alpha+\beta \leq 0.5$, $x \leq 0.7$, $0 \leq y \leq 1$, $z \leq 0.1$), d) Cu$_\alpha$(In$_{1-x}$Ga$_x$)$_\beta$(Se$_{1-y-z}$S$_y$Te$_z$)$_{1-\alpha-\beta}$ ($0.2 \leq \alpha \leq 0.25$, $0.23 \leq \beta \leq 0.28$, $\alpha+\beta \leq 0.5$, $x \leq 0.7$, $y \leq 0.4$, $z = 0$).

The fourth example multilayer structure comprises [Cu$_\alpha$(In$_{1-x}$Ga$_x$)$_\beta$(Se$_{1-y-z}$S$_y$Te$_z$)$_{1-\alpha-\beta}$]$_N$, (where, in particular embodiments, for each layer $0 \leq \alpha \leq 1$, $0 \leq \beta \leq 1$, $x \leq 0.7$, $0 \leq y \leq 1$, $0 \leq z \leq 1$, total concentration of Cu, In+Ga, and Se+S+Te across all N layers should not exceed 30 at. %, 30 at. % and 70 at. %, respectively and total number of layers $N \leq 100$). In particular embodiments, the thickness of each layer in the multilayer structure may range from 0 to 6 µm while the total thickness of the N layer structure is less than approximately 8 µm. By way of example, following layer structures may be used for the subsequent annealing process of particular embodiments:

a) Cu$_\alpha$(In$_{1-x}$Ga$_x$)$_\beta$(Se$_{1-y}$S$_y$)$_{1-\alpha-\beta}$ ($0.18 \leq \alpha \leq 0.25$, $0.2 \leq \beta \leq 0.28$, $\alpha+\beta \leq 0.5$, $0.2 \leq x \leq 0.5$, $0 \leq y \leq 1$) (0.3-2 µm thickness)/Cu$_\alpha$(In$_{1-x}$Ga$_x$)$_\beta$(Se$_{1-y}$S$_y$)$_{1-\alpha-\beta}$ ($0.18 \leq \alpha \leq 0.25$, $0.2 \leq \beta \leq 0.28$, $\alpha+\beta \leq 0.5$, $0.1 \leq \alpha \leq 0.3$, $0 \leq y \leq 1$) (0.2-2 µm thickness)/Cu$_\alpha$(In$_{1-x}$Ga$_x$)$_\beta$(Se$_{1-y}$S$_y$)$_{1-\alpha-\beta}$ ($0.18 \leq \alpha \leq 0.25$, $0.2 \leq \beta \leq 0.28$, $\alpha+\beta \leq 0.5$, $0 \leq x \leq 0.25$, $0 \leq y \leq 1$) (0.3-2 µm thickness), b) Cu$_\alpha$(In$_{1-x}$Ga$_x$)$_\beta$(Se$_{1-y-z}$S$_y$Te$_z$)$_{1-\alpha-\beta}$ ($0.18 \leq \alpha \leq 0.25$, $0.2 \leq \beta \leq 0.28$, $\alpha+\beta \leq 0.5$, $0.2 \leq x \leq 0.5$, $0 \leq y \leq 1$, $z \leq 0.1$) (0.3-2 µm thickness)/Cu$_\alpha$(In$_{1-x}$Ga$_x$)$_\beta$(Se$_{1-y-z}$S$_y$Te$_z$)$_{1-\alpha-\beta}$ ($0.18 \leq \alpha \leq 0.25$, $0.2 \leq \beta \leq 0.28$, $\alpha+\beta \leq 0.5$, $0.1 \leq x \leq 0.3$, $0 \leq y \leq 1$, $z \leq 0.1$) (0.3-2 µm thickness)/Cu$_\alpha$(In$_{1-x}$Ga$_x$)$_\beta$(Se$_{1-y-z}$S$_y$Te$_z$)$_{1-\alpha-\beta}$ ($0.18 \leq \alpha \leq 0.25$, $0.2 \leq \beta 0.28$, $\alpha+\beta \leq 0.5$, $0 \leq x \leq 25$, $0 \leq y \leq 1$, $z \leq 0.1$) (0.3-2 µm thickness).

In particular embodiments, the multilayer structures described above may be deposited (e.g., by conventional sputtering or magnetron sputtering) in vacuum or in an atmosphere that consists of or includes at least one of the following gases: Ar, H, N$_2$, O$_2$, H$_2$S, and H$_2$Se. In particular embodiments, one or more of the layers of the multilayer structures described above may be doped (e.g., up to approximately 4 atomic percent (atomic %)) with at least one of the following elements: Na, P, K, N, B, As, and Sb. In particular embodiments, to improve the electrical properties of the resultant CIGS absorbers and to optimize the subsequent annealing process, Cu and Cu$_{1-\beta}$(Se$_{1-y-z}$S$_y$Te$_z$)$_\beta$ layers may contain up to approximately 20 atomic % of at least one of the following elements: Al, Si, Ti, V, Zn, Ga, Zr, Nb, Mo, Ru, Pd, In, Sn, Ta, W, Re, Ir, Pt, Au, Pb, and Bi. In particular embodiments, In$_{1-x}$Ga$_x$ and (In$_{1-x}$Ga$_x$)$_{1-\alpha}$(Se$_{1-y-z}$S$_y$Te$_z$)$_\alpha$ layers may contain up to approximately 20 atomic % of at least one of the following elements: Al, Si, Ti, V, Cu, Zn, Zr, Nb, Mo, Ru, Pd, Sn, Ta, W, Re, Ir, Pt, Au, Pb, and Bi. In particular embodiments, Cu$_\alpha$(In$_{1-x}$Ga$_x$)$_\beta$(Se$_{1-y-z}$S$_y$Te$_z$)$_\gamma$ layers may contain up to approximately 20 atomic % of at least one of the following elements: Al, Si, Ti, V, Zn, Zr, Nb, Mo, Ru, Pd, Sn, Ta, W, Re, Ir, Pt, Au, Pb, and Bi. In particular embodiments, if, in the proposed layer structures, the total concentration of Cu is larger than the total concentration of In and Ga, the layers may be etched (e.g., using KCN for etching Cu-rich phases) after the subsequent annealing process to remove Cu-rich phases, which may be detrimental for CIGS performance.

In particular embodiments, all of the layers described above, except Se$_{1-y-z}$S$_y$Te$_z$, may be deposited by magnetron sputtering. In particular embodiments, the Se$_{1-y-z}$S$_y$Te$_z$ may be deposited using thermal evaporation techniques. In particular embodiments, Cu, In$_{1-x}$Ga$_x$, (In$_{1-x}$Ga$_x$)$_{1-\alpha}$(Se$_{1-y-z}$S$_y$Te$_z$)$_\alpha$, Cu$_{1-\beta}$(Se$_{1-y-z}$S$_y$Te$_z$)$_\beta$, and Cu$_\alpha$(In$_{1-x}$Ga$_x$)$_\beta$(Se$_{1-y-z}$S$_y$Te$_z$)$_\gamma$ layers may be deposited over either non-heated substrates or over substrates that have been pre-heated to temperatures up to, by way of example, 12 degrees Celsius. By way of example, the following substrate temperature conditions may be used during the sputtering of Cu, $In_{1-x}Ga_x$, $(In_{1-x}Ga_x)_{1-\alpha}(Se_{1-y-z}S_yTe_z)_\alpha$, $Cu_{1-\beta}(Se_{1-y-z}S_yTe_z)_\beta$, and $Cu_\alpha(In_{1-x}Ga_x)_\beta(Se_{1-y-z}S_yTe_z)_\gamma$ layers:

a) The substrate temperature is kept below approximately 200 degrees Celsius during layer deposition to minimize the evaporation of S, Se, and Te from the deposited multilayer stack, b) The substrate temperature is first kept below approximately 200 degrees Celsius for sputtering at least one of the layers and then is subsequently increased to temperatures between, by way of example, 200 degrees Celsius and 600 degrees Celsius for sputtering the remaining layers (e.g., $(In_{1-x}Ga_x)_{1-\alpha}(Se_{1-y-z}S_yTe_z)_\alpha$ is deposited at approximately 200 degrees Celsius and then $Cu_{1-\beta}(Se_{1-y-z}S_yTe_z)_\beta$ is deposited over $(In_{1-x}Ga_x)_{1-\alpha}(Se_{1-y-z}S_yTe_z)_\alpha$, at a temperature of approximately 550 degrees Celsius, c) The substrate temperature is kept between approximately 200 and 400 degrees Celsius during layer deposition, d) The substrate temperature is first kept below approximately 450 degrees Celsius for sputtering at least one layer and then is increased to temperatures between, by way of example, 400 and 700 degrees Celsius for sputtering the remaining layers, e) The substrate temperature is first kept below 450 degrees Celsius for sputtering at least one layer, then is increased to temperatures between, by way of example, 400 and 700 degrees Celsius for sputtering at least one layer, and then is decreased to temperatures between, by way of example, 550 and 100 degrees Celsius for sputtering the remaining layers (e.g., $(In_{1-x}Ga_x)_{1-\alpha}(Se_{1-y-z}S_yTe_z)_\alpha$ is deposited at approximately 200 degrees Celsius, then $Cu_{1-\beta}(Se_{1-y-z}S_yTe_z)_\beta$ is deposited over $(In_{1-x}Ga_x)_{1-\alpha}(Se_{1-y-z}S_yTe_z)_\alpha$ at a temperature of approximately 550 degrees Celsius, and then $(In_{1-x}Ga_x)_{1-\alpha}(Se_{1-y-z}S_yTe_z)_\alpha$ is deposited over $(In_{1-x}Ga_x)_{1-\alpha}(Se_{1-y-z}S_yTe_z)_\alpha/Cu_{1-\beta}(Se_{1-y-z}S_yTe_z)_\beta$ layers at approximately 500 degrees Celsius.

Figures 3A, 3B, 3C, 3D:
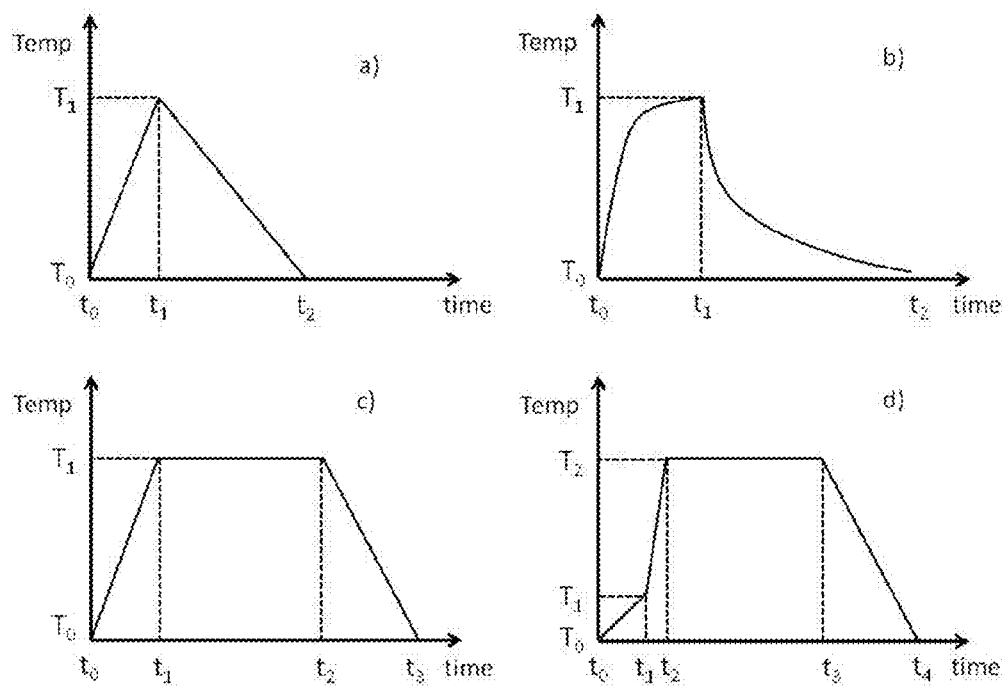
FIGS. 3A-3D illustrate example methods of annealing.

In particular embodiments, the annealing of the multilayer thin film structures described above can be performed using a light source, such as, by way of example, a halogen lamp or a laser, as well as additionally or alternately, using resistive heaters. The heating may be effected either directly onto the surface of the multilayer thin film structure or by way of the back substrate. By way of example, FIGS. 3A-3D illustrate various methods of annealing the multilayer structures described above. More particularly, FIGS. 3A, 3C, and 3D show simplified plots of the dependence of the temperature of a multilayer structure as a function of time (T(t)) during annealing of the multilayer structure. Even more particularly, in FIG. 3A, the temperature of the multilayer structure is first increased from $T_0$ to $T_1$ with a temperature ramp rate (increase rate) of $(T_1-T_0)/(t_1-t_0)$ followed by a decrease to $T_0$ with a cooling rate of $(T_0-T_1)/(t_2-t_1)$. FIG. 3B shows a more realistic representation of the temperature dependence (T(t)) of the multilayer structure during the annealing process. More specifically, as shown in FIG. 3B, the ramp rate usually decreases at higher temperatures and the cooling rate is usually faster at higher temperatures. However, for some cases, a linear temperature dependence is assumed for simplicity reasons. Continuing with the example annealing process shown in FIG. 3C, the temperature of the multilayer structure is first increased from $T_0$ to $T_1$ with a temperature ramp rate of $(T_1-T_0)/(t_1-t_0)$. The temperature of the multilayer structure is then kept at approximately $T_1$ for a time $t_2-t_1$ before subsequently reducing the temperature to $T_0$ with a cooling rate of $(T_0-T_1)/(t_3-t_2)$. Finally, in the example annealing process shown in FIG. 3D, the multilayer structure is first preheated to a temperature $T_1$ before increasing the temperature of the multilayer structure from $T_1$ to $T_2$ with a temperature ramp rate of $(T_2-T_1)/(t_2-t_1)$. The temperature of the multilayer structure is then kept at approximately $T_2$ for a time $t_3-t_2$ before subsequently reducing the temperature to $T_0$ with a cooling rate of $(T_0-T_2)/(t_4-t_3)$.

Figures 4A, 4B, 4C:
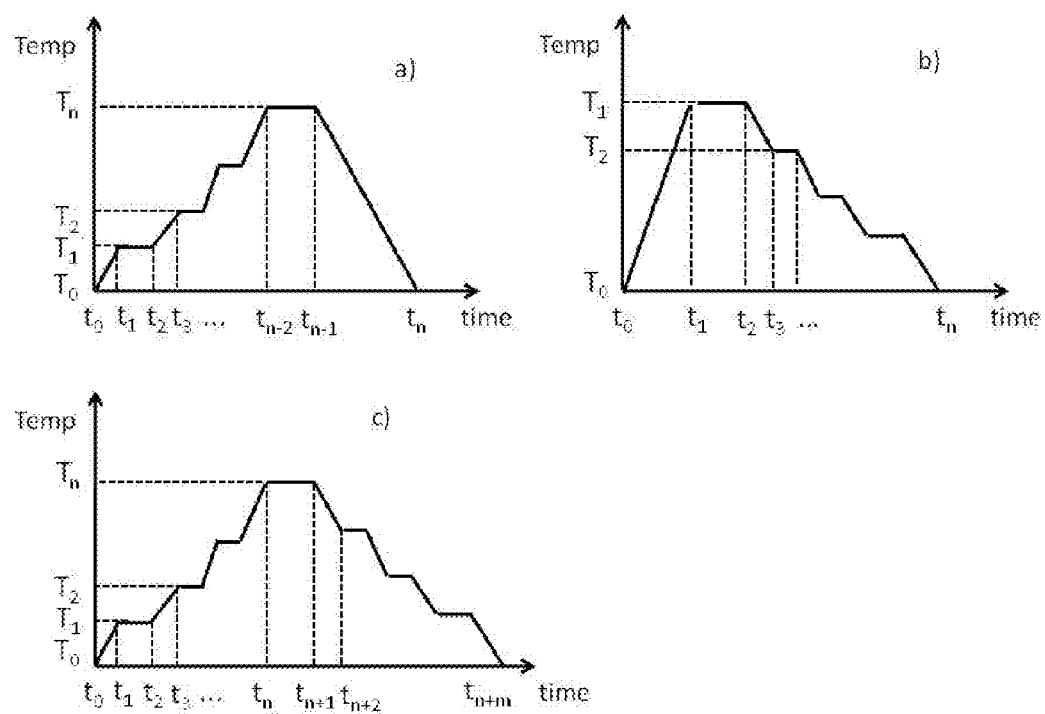
FIGS. 4A-4C illustrate alternate step-wise example methods of annealing.

FIGS. 4A-4C illustrate various alternate step-wise methods of annealing the multilayer structures described above. More particularly, FIG. 4A illustrates an annealing process in which the multilayer structure is first heated to $T_1$ with a ramp rate of $(T_1-T_0)/(t_1-t_0)$, then kept at approximately $T_1$ for a time $t_2-t_1$, then heated to $T_2$ with a ramp rate of $(T_2-T_1)/(t_3-t_2)$, then kept at approximately $T_2$ for a time $t_4-t_3$, and so on until a target temperature $T_n$ is reached. FIG. 4B illustrates an annealing process in which the multilayer structure is first heated to the highest target temperature $T_1$ where annealing is performed at $T_1$ for a time $t_2-t_1$, followed by step-wise cooling. More particularly, the temperature of the multilayer structure is decreased to $T_2$ at a rate $(T_2-T_1)/(t_3-t_2)$ followed by maintaining the temperature at approximately $T_2$ for a time $t_4-t_3$ and so on until a target temperature $T_0$ is reached. FIG. 4C illustrates an annealing process in which the multilayer structure is heated using the step-wise heating method described with reference to FIG. 4A and then subsequently cooled using the step-wise cooling method described with reference to FIG. 4B.

In particular embodiments, during the annealing process, the multilayer structure is annealed according to one of the following more specific methods. In particular embodiments, the annealing comprises pulsed or flash annealing.

1) The multilayer structure is heated with a heating ramp rate of or exceeding 1 degree Celsius per second to a highest temperature below approximately 1200 degrees Celsius, followed by cooling at a cooling rate of or exceeding 0.1 degrees Celsius per second to a temperature below, for example, 300 degrees Celsius. However, in embodiments in which the annealing process utilizes laser annealing, the heating ramp rate may exceed, for example, $10^6$ degrees Celsius per second.

2) The multilayer structure is heated with a heating ramp rate exceeding 1 degree Celsius per second to a highest temperature below approximately 1200 degrees Celsius, followed by cooling at a cooling rate exceeding 1 degree Celsius per second to a temperature below 300 degrees Celsius.

3) The multilayer structure is heated with a heating ramp rate exceeding 1 degree Celsius per second to a highest temperature below approximately 1200 degrees Celsius, then kept at this temperature for less than 60 minutes, followed by cooling at a cooling rate of or exceeding 0.1 degree Celsius per second to a temperature below 300 degrees Celsius.

4) The multilayer structure is heated with a heating ramp rate exceeding 1 degree Celsius per second to a highest temperature below approximately 650 degrees Celsius, then kept at this temperature for less than 60 minutes, followed by cooling at a cooling rate exceeding 0.1 degree Celsius per second to a temperature below 300 degrees Celsius.

5) The multilayer structure is first pre-heated to a temperature below approximately 400 degrees Celsius, then heated with a heating ramp rate exceeding 1 degree Celsius per second to a highest temperature below approximately 1200 degrees Celsius, then kept at this temperature for less than 60 minutes, followed by cooling at a cooling rate exceeding 0.1 degree Celsius per second to a temperature below 300 degrees Celsius.

6) The multilayer structure is heated with a heating ramp rate exceeding 1 degree Celsius per second to a highest temperature below approximately 1200 degrees Celsius, then kept at this temperature for less than 60 minutes, then cooled at a cooling rate exceeding 0.1 degree Celsius per second to a temperature below 600 degrees Celsius, then kept at this temperature for less than 60 minutes, then cooled with a cooling rate exceeding 0.1 Celsius per second to a temperature below 300 degrees Celsius.

7) The multilayer structure is first pre-heated to a temperature below approximately 400 degrees Celsius, then heated with a heating ramp rate exceeding 1 degree Celsius per second to a highest temperature below approximately 1200 degrees Celsius, then kept at this temperature for less than 60 minutes, then cooled at a cooling rate exceeding 0.1 degree Celsius per second to a temperature below approximately 600 Celsius, then kept at this temperature for less than 60 minutes, then cooled with a cooling rate exceeding 0.1 Celsius per second to a temperature below 300 degrees Celsius.

8) The multilayer structure is first pre-heated to a temperature below approximately 400 degrees Celsius, then heated with a heating ramp rate exceeding 1 degree Celsius per second to a highest temperature below approximately 650 degrees Celsius, then kept at this temperature for less than 60 minutes, then cooled at a cooling rate exceeding 0.1 degree Celsius per second to a temperature below approximately 560 degrees Celsius, then kept at this temperature for less than 60 minutes, then cooled with a cooling rate exceeding 0.1 Celsius per second to a temperature below 300 degrees Celsius.

In particular embodiments, the annealing processes described above may be performed in vacuum or in the presence of an atmosphere of gas. By way of example, the atmosphere of gas may include or consist of at least one of H, He, $N_2$, $O_2$, Ar, $H_2S$, Kr, $H_2Se$, or Xe. In particular embodiments, the pressure of the gas atmosphere may range from, by way of example, 1E-8 Pa to approximately 1E7 Pa. In an alternate embodiment, the multilayer structures described above may first be annealed in vacuum followed by annealing in the presence of at least one gas as just described.

Figure 5:
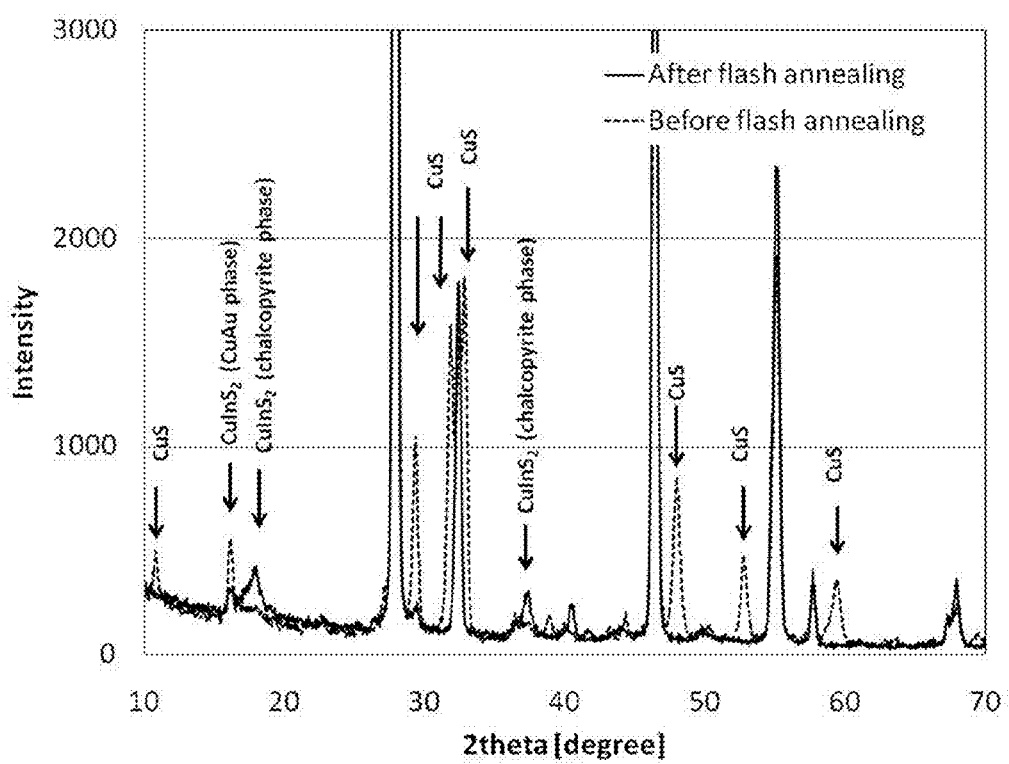
FIG. 5 illustrates an example plot of X-ray diffraction data.

In one particular embodiment, a multilayer structure comprising $In_{1-x}Cu_x$ (where x is less than or equal to approximately 0.5) and $In_{1-x}Cu_x$ (where x is greater than or equal to approximately 0.5) is sputtered in the presence of a reactive $H_2S$ atmosphere at approximately 500 degrees Celsius. In one experiment, the total composition of Cu in the resultant multilayer structure was higher than that of In resulting in the formation of CuS phases in conjunction with CuInS2. By way of example, as illustrated in FIG. 5, which plots X-ray diffraction data, the resultant multilayer structure shows the formation of chalcopyrite ordered (signature peak (110) at 17.8°) and CuAu ordered (signature peak (001) at 16°) $CuInS_2$ phases in the film structure. The chalcopyrite ordering of $CuInSe_2$ may generally be more attractive for high efficiency CIGS based photovoltaic cells. This multilayer structure may then be annealed with, by way of example, a halogen lamp at a heating ramp rate of approximately 3 degrees Celsius per second to a maximum annealing temperature of approximately 550 degrees Celsius and with an annealing time at the maximum annealing temperature of approximately 2 minutes. In one experiment, after such annealing of this multilayer structure, the majority of the CuAu phase was transformed into a chalcopyrite phase. This is evidenced by the X-ray spectra of FIG. 5, which shows a reduction in the intensity of the CuAu-ordering peak (peak (001) at 16°) and an increase of the intensity of the chalcopyrite peak (peak (110) at 17.8°). Additionally, the experiment demonstrated that the majority of the CuS phase evaporated from the film structure. As those of skill in the art may appreciate, CuS is highly conductive and, hence, its presence in CIGS absorbers is detrimental to the performance of photovoltaic cells. Thus, annealing in accordance to particular embodiments described above, can improve the ordering in $CuInS_2$ (as well as in $CuInSe_2$) and, furthermore, remove the CuS phase from the film, both of which improve the quality of the CIGS absorber in a photovoltaic cell.

As another example, a $(In_{1-x}Ga_x)_2Se_3/Cu_2Se$ (where x is less than or equal to approximately 0.7) multilayer structure may be sputtered at temperatures below approximately 400 degrees Celsius, followed by annealing under the following conditions. First, the multilayer structure is heated with a ramp rate exceeding 1 degree Celsius per second to a maximum annealing temperature below approximately 600 degrees Celsius. The multilayer structure may then be held at approximately the maximum temperature for less than approximately 40 minutes. The multilayer structure may then be cooled at a cooling rate exceeding approximately 0.1 degrees Celsius per second. This annealing process may be performed in an atmosphere that consists of at least one of He, Ar, $N_2$, $H_2S$, and $H_2Se$. The gas pressure may be an important parameter and may be varied from, by way of example, 1E-8 Pa (vacuum) to 1E7 Pa. In an even more particular example, the $(In_{1-x}Ga_x)_2Se_3/Cu_2Se$ multilayer structure may be annealed below 600 degrees Celsius in vacuum for less than 30 minutes followed by cooling in less than 14 Pa of a $H_2S$ atmosphere at a cooling rate exceeding 0.1 degrees Celsius per second to a temperature below 300 degrees Celsius.

As another example, a $(In_{1-x}Ga_x)_2Se_3/CuSe_2$ (where x is less than or equal to approximately 0.7) multilayer structure may be sputtered at temperatures below approximately 400 degrees Celsius, followed by annealing under the following conditions. First, the multilayer structure is heated with a ramp rate exceeding 1 degree Celsius per second to a maximum annealing temperature below approximately 600 degrees Celsius. The multilayer structure may then be held at approximately the maximum temperature for less than approximately 40 minutes. The multilayer structure may then be cooled at a cooling rate exceeding approximately 0.1 degrees Celsius per second to a temperature below approximately 550 degrees Celsius. The multilayer structure may then be held at approximately this temperature for less than 40 minutes followed by cooling at a cooling rate exceeding 0.1 degrees Celsius per second to a temperature below approximately 300 degrees Celsius. This annealing process may be performed in an atmosphere that consists of at least one of He, Ar, $N_2$, $H_2S$, and $H_2Se$. Again, the gas pressure may be an important parameter and may be varied from, by way of example, 1E-8 Pa (vacuum) to 1E7 Pa. In an even more particular example, the $(In_{1-x}Ga_x)_2Se_3/CuSe_2$ multilayer structure may be annealed below 600 degrees Celsius in vacuum for less than 30 minutes followed by cooling in vacuum to a temperature below 550 degrees Celsius, then annealed at approximately this temperature for less than 30 minutes in less than 14 Pa of a $H_2S$ atmosphere, followed by cooling at a cooling rate exceeding 0.1 degrees Celsius per second to a temperature below 300 degrees Celsius.

As another example, a $In_{1-x}Ga_x/Cu_2Se/CuSe_2$ (where x is less than or equal to approximately 0.7) multilayer structure may be annealed under the following conditions. First, the multilayer structure is heated with a ramp rate exceeding 1 degree Celsius per second to a maximum annealing temperature below approximately 600 degrees Celsius. The multilayer structure may then be held at approximately the maximum temperature for less than approximately 40 minutes. The multilayer structure may then be cooled at a cooling rate exceeding approximately 0.1 degrees Celsius per second. Again, this annealing process may be performed in an atmosphere that consists of at least one of He, Ar, $N_2$, $H_2S$, and $H_2Se$, and again, the gas pressure may be an important parameter and may be varied from, by way of example, 1E-8 Pa (vacuum) to 1E7 Pa.

As another example, a $Cu(In_{1-x}Ga_x)S$ (where x is less than or equal to approximately 0.7) multilayer structure may be annealed under the following conditions. First, the multilayer structure is heated with a ramp rate exceeding 1 degree Celsius per second to a maximum annealing temperature below approximately 600 degrees Celsius. The multilayer structure may then be held at approximately the maximum temperature for less than approximately 40 minutes. The multilayer structure may then be cooled at a cooling rate exceeding approximately 0.1 degrees Celsius per second. Again, this annealing process may be performed in an atmosphere that consists of at least one of He, Ar, $N_2$, $H_2S$, and $H_2Se$, and again, the gas pressure may be an important parameter and may be varied from, by way of example, 1E-8 Pa (vacuum) to 1E7 Pa.

In particular embodiments, shorter annealing times are used to minimize the production time for the resultant CIGS absorbers. Moreover, shorter annealing times, as described above, can minimize the loss of S, Se, and Te in these absorbers.

Additionally, a number of process enhancements may also be implemented in particular embodiments to minimize and/or compensate for chalcogenide depletion during processing and/or annealing. By way of example, given the precise control that can be achieved in the previously described process pathways, some embodiments may start off with an excess of the chalcogenide in the absorber layer (in either elemental or compound forms) such that the depletion that occurs during thermal processing is precisely accounted for and, thus, the processing results in a CIGS absorber having the desired end stoichiometry. As another example, some embodiments may include the simultaneous thermal processing of two samples (two multilayer CIGS structures) positioned in contact (or in close proximity) face-to-face with one another such that the evaporative losses of S, Se, and Te of each sample are minimized due to the material confinement and local over-pressure that results.

The present disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend.

What is claimed is:

1. A method comprising:
   depositing a first film layer onto a substrate, wherein the film layer includes one or more of Se, Te and S, and either Cu or one or more of In and Ga, and wherein the one or more of Se, Te and S in the aggregate is less than or equal to 80 atomic percent;
   depositing a second film layer onto the first film layer, wherein the second film layer comprises Cu if the first film thin contains In and/or Ga, or In and/or Ga if the first film layer contains Cu;
   depositing a third film layer over the first and second film layers, wherein the third film layer comprises over 20 atomic percent of Se, Te and/or S in the aggregate;
   annealing the first, second and third deposited film layers at an average heating rate of or exceeding 1 degree Celsius per second;
   removing excess material from one or more of the first, second, or third film layers, the excess material comprising Cu and one or more of S, Se, or Te; and
   cooling the annealed first, second and third film layers at an average cooling rate of or exceeding 0.1 degrees Celsius per second.

2. The method of claim 1 wherein at least one of the film layers comprises $[Cu/In_{1-x}Ga_x]_N/Se_{1-y-z}S_yTe_z$ (where $x \leq 0.7$, $0 \leq y \leq 1$, $0 \leq z \leq 1$, $N \leq 100$).

3. The method of claim 1 wherein at least one of the film layers comprises $[(In_{1-x}Ga_x)_{1-\alpha}(Se_{1-y-z}S_yTe_z)_\alpha/Cu_{1-\beta}(Se_{1-y-z}S_yTe_z)_\beta]_N$ (where $x \leq 0.7$, $\alpha \leq 0.8$, $\beta \leq 0.8$, $0 \leq y \leq 1$, $0 \leq z \leq 1$, $N \leq 100$).

4. The method of claim 1 wherein at least one of the film layers comprises $Cu_\alpha(In_{1-x}Ga_x)_\beta(Se_{1-y-z}S_yTe_z)_{1-\alpha-\beta}$, (where $0.1 \leq \alpha \leq 0.4$, $0.1 \leq \beta \leq 0.4$, $\alpha+\beta \leq 0.7$, $x \leq 0.7$, $0 \leq y \leq 1$, $0 \leq z \leq 1$) layer.

5. The method of claim 1 wherein the one or more film layers are deposited in vacuum.

6. The method of claim 1 wherein the one or more film layers are deposited in an atmosphere that consists of or includes at least one of the following gases: Ar, H, $N_2$, $O_2$, $H_2S$, and $H_2Se$.

7. The method of claim 1 wherein at least one of the one or more film layers are doped with at least one of the following elements: Na, P, K, N, B, As, and Sb.

8. The method of claim 1 wherein annealing the one or more deposited film layers comprises pre-heating the one or more deposited film layers to a first temperature, wherein the one or more deposited film layers is heated to a second temperature at the average heating rate.

9. The method of claim 1 wherein annealing the one or more deposited film layers is performed in vacuum.

10. The method of claim 1 wherein annealing the one or more deposited film layers is performed in the presence of an atmosphere of gas.

11. The method of claim 1 wherein annealing the one or more deposited film layers is performed in vacuum followed by annealing in the presence of at least one gas.

12. The method of claim 1 wherein the atomic percent of Se, Te and/or S in the aggregate increases from the first to the third deposited film layer.

13. The method of claim 1 wherein the third film layer contains less than or equal to 25 atomic percent of In and Ga in the aggregate.

14. The method of claim 1 wherein annealing is performed using an external heating source.

15. The method of claim 1 wherein annealing is performed using pulse or flash annealing.

16. The method of claim 1 wherein annealing is performed at an average heating rate of approximately 1 degree Celsius per second.

17. The method of claim 1 wherein annealing is performed at an average heating rate of less than 10 degrees Celsius per second.

18. The method of claim 1 wherein cooling is performed at an average cooling rate of approximately 0.1 degree Celsius per second.

19. The method of claim 1 wherein:
annealing comprises heating the deposited film layers to a first temperature below approximately 1200 degrees Celsius; and
cooling comprises cooling the film layers to a second temperature below 300 degrees Celsius.

20. The method of claim 1 wherein:
annealing comprises heating the deposited film layers to a first temperature below approximately 1200 degrees Celsius; and
cooling comprises cooling the film layers at an average cooling rate of or exceeding 1 degree Celsius per second to a second temperature below 300 degrees Celsius.

21. The method of claim 1 wherein:
annealing comprises heating the deposited film layers to a first temperature below approximately 1200 degrees Celsius and holding at the first temperature for less than 60 minutes; and
cooling comprises cooling the film layers to a second temperature below 300 degrees Celsius.

22. The method of claim 1 wherein:
annealing comprises heating the deposited film layers to a first temperature below approximately 650 degrees Celsius and holding at the first temperature for less than 60 minutes; and
cooling comprises cooling one or more of the film layers to a second temperature below 300 degrees Celsius.

23. The method of claim 1 wherein:
annealing comprises pre-heating the deposited film layers to a first temperature below approximately 400 degrees Celsius, heating the deposited film layers to a second temperature below approximately 1200 degrees Celsius, and holding at the second temperature for less than 60 minutes; and
cooling comprises cooling the film layers to a third temperature below 300 degrees Celsius.

24. The method of claim 1 wherein:
annealing comprises heating the deposited film layers to a first temperature below approximately 1200 degrees Celsius; and
cooling comprises cooling the film layers to a second temperature below 600 degrees Celsius, holding at the second temperature for less than 60 minutes, and then cooling the film layers to a third temperature below 300 degrees Celsius.

25. The method of claim 1 wherein:
annealing comprises pre-heating the deposited film layers to a first temperature below approximately 400 degrees Celsius, heating the deposited film layers to a second temperature below approximately 1200 degrees Celsius, and holding at the second temperature for less than 60 minutes; and
cooling comprises cooling the film layers to a third temperature below approximately 600 degrees Celsius, holding at the third temperature for less than 60 minutes, and cooling to a fourth temperature below 300 degrees Celsius.

26. The method of claim 1 wherein:
annealing comprises pre-heating the deposited film layers to a first temperature below approximately 400 degrees Celsius, heating the deposited film layers to a second temperature below approximately 650 degrees Celsius, and holding at the second temperature for less than 60 minutes; and
cooling comprises cooling the film layers to a third temperature below approximately 560 degrees Celsius, holding at the third temperature for less than 60 minutes, and cooling to a fourth temperature below 300 degrees Celsius.

27. The method of claim 1 wherein one or more of the first, second, or third film layers has a thickness of 0.15 to 8.0 µm.

28. The method of claim 1 wherein one or more of the first, second, or third film layers comprises $In_{1-x}Cu_x$ (where $x>0.5$).

29. The method of claim 1 wherein annealing the first, second, and third deposited film layers results in the formation of $Cu(In, Ga)(S, Se, Te)_2$ with a tetragonal chalcopyrite crystal structure.

30. The method of claim 1 wherein removing the excess material occurs during annealing.

31. The method of claim 1 wherein the excess material comprises $Cu_{1-x}S_x$ (where $0.2 \leq x \leq 1$).

32. The method of claim 1 wherein the excess material comprises $Cu_{1-x}Se_x$ (where $0.2 \leq x \leq 1$).

33. The method of claim 1 wherein the excess material comprises $Cu_{1-x}(S, Se)_x$ (where $0.2 \leq x \leq 1$).

34. The method of claim 1 wherein the excess material comprises $Cu_{1-x}(S, Se, Te)_x$ (where $0.2 \leq x \leq 1$).

35. The method of claim 1 wherein the excess material comprises $Cu_{1-x}(Se_{1-y}S_yTe_z)_x$ (where $0.1 \leq x < 1$, $0 \leq y \leq 1$, $0 \leq z \leq 1$).

36. The method of claim 2 wherein at least one of the film layers comprises up to approximately 20 atomic % of at least one of the following elements: Al, Si, Ti, V, Zn, Ga, Zr, Nb, Mo, Ru, Pd, In, Sn, Ta, W, Re, Ir, Pt, Au, Pb, and Bi.

37. The method of claim 2 wherein at least one of the film layers comprises $[Cu_\alpha(In_{1-x}Ga_x)_\beta(Se_{1-y-z}S_yTe_z)_{1-\alpha-\beta}]_N$, (where for each layer $0 \leq \alpha \leq 1$, $0 \leq \beta \leq 1$, $x \leq 0.7$, $0 \leq y \leq 1$, $0 \leq z \leq 1$, and total concentration of Cu, In and Ga, and Se+S+Te across all N layers does not exceed 30 at. %, 30 at. % and 70 at. %, respectively and a total number of layers $N \leq 100$).

38. The method of claim 4 wherein, for $0.5 < \alpha + \beta \leq 0.7$, the film layer is annealed in the presence of $H_2S$ and/or $H_2Se$.

* * * * *